US008607076B2

(12) United States Patent
Lester et al.

(10) Patent No.: US 8,607,076 B2
(45) Date of Patent: Dec. 10, 2013

(54) CIRCUIT APPARATUS WITH MEMORY AND POWER CONTROL RESPONSIVE TO CIRCUIT-BASED DETERIORATION CHARACTERISTICS

(75) Inventors: Nathan Loren Lester, Minneapolis, MN (US); Duane James Farling, Lakeville, MN (US)

(73) Assignee: Seagate Technology LLC, Cupertino, CA (US)

( * ) Notice: Subject to any disclaimer, the term of this patent is extended or adjusted under 35 U.S.C. 154(b) by 729 days.

(21) Appl. No.: 12/632,515

(22) Filed: Dec. 7, 2009

(65) Prior Publication Data

US 2010/0332862 A1  Dec. 30, 2010

Related U.S. Application Data

(60) Provisional application No. 61/220,851, filed on Jun. 26, 2009.

(51) Int. Cl.
*G06F 1/00* (2006.01)

(52) U.S. Cl.
USPC ........................................................ 713/300

(58) Field of Classification Search
USPC ........................................................ 713/300
See application file for complete search history.

(56) References Cited

U.S. PATENT DOCUMENTS

| | | | |
|---|---|---|---|
| 4,510,400 A | 4/1985 | Kiteley | |
| 5,367,489 A | 11/1994 | Park et al. | |
| 5,402,008 A * | 3/1995 | St. John | 307/64 |
| 5,459,850 A | 10/1995 | Clay et al. | |
| 5,483,486 A | 1/1996 | Javanifard et al. | |
| 5,497,119 A | 3/1996 | Tedrow et al. | |
| 5,537,360 A | 7/1996 | Jones et al. | |
| 5,546,042 A | 8/1996 | Tedrow et al. | |
| 5,567,993 A | 10/1996 | Jones et al. | |
| 5,592,420 A | 1/1997 | Cernea et al. | |
| 5,914,542 A | 6/1999 | Weimer et al. | |
| 5,959,926 A | 9/1999 | Jones et al. | |
| 6,091,617 A | 7/2000 | Moran | |
| 6,259,171 B1 * | 7/2001 | Cheng | 307/85 |

(Continued)

OTHER PUBLICATIONS

N. Li, J. Zhang, and Y. Zhong, "A Novel Charging Control Scheme for Super Capacitor Energy Storage in Photovoltaic Generation System," DRPT2008 Apr. 6-9, 2008 Nanjing China.

(Continued)

*Primary Examiner* — Thomas Lee
*Assistant Examiner* — Terrell Johnson
(74) *Attorney, Agent, or Firm* — Crawford Maunu PLLC

(57) ABSTRACT

Power-backup capabilities are provided by implementing a variety of different methods, systems and devices. According to one such implementation, a memory device stores data in response to data accesses under the control of a memory control circuit. A solid-state memory circuit and a volatile caching memory circuit provide the memory control circuit with access to a set of common data. A circuit carries primary operating power to the memory device. A backup power circuit has a power module having and securing a power-reservoir circuit. A capacitor holds a charge to provide operating power to the memory circuits to permit transfer of the data from the volatile memory circuit to the solid-state memory circuit. A notification circuit provides an external user indication of the power-reservoir circuit integrity. A circuit-based structure secures the power-reservoir circuit for operation as part of the memory device and facilitates replacement of the power-reservoir circuit.

18 Claims, 7 Drawing Sheets

(56) References Cited

U.S. PATENT DOCUMENTS

| | | | |
|---|---|---|---|
| 6,404,647 | B1 | 6/2002 | Minne' |
| 6,567,261 | B2 | 5/2003 | Kanouda et al. |
| 6,700,352 | B1 | 3/2004 | Elliott et al. |
| 6,788,027 | B2 | 9/2004 | Malik |
| 6,838,923 | B2 | 1/2005 | Pearson |
| 6,957,355 | B2 * | 10/2005 | Acton et al. .......... 713/340 |
| 6,981,161 | B2 | 12/2005 | Koo |
| 7,019,583 | B2 | 3/2006 | Del Signore, II et al. |
| 7,173,821 | B2 | 2/2007 | Coglitore |
| 7,177,222 | B2 | 2/2007 | Spengler |
| 7,233,890 | B2 | 6/2007 | Shapiro et al. |
| 7,268,998 | B2 | 9/2007 | Ewing et al. |
| 7,269,755 | B2 | 9/2007 | Moshayedi et al. |
| 7,305,572 | B1 | 12/2007 | Burroughs et al. |
| 7,310,707 | B2 | 12/2007 | Olds et al. |
| 7,318,121 | B2 | 1/2008 | Gaertner et al. |
| 7,321,521 | B2 | 1/2008 | Spengler |
| 7,334,144 | B1 | 2/2008 | Schlumberger |
| 7,404,073 | B2 | 7/2008 | Felts |
| 7,404,131 | B2 | 7/2008 | McCarthy et al. |
| 7,414,335 | B2 | 8/2008 | Hussein et al. |
| 7,487,391 | B2 | 2/2009 | Pecone et al. |
| 2006/0080515 | A1 | 4/2006 | Spiers et al. |
| 2007/0223870 | A1 | 9/2007 | Farling et al. |
| 2008/0007219 | A1 | 1/2008 | Williams |
| 2008/0232144 | A1 | 9/2008 | Klein |
| 2009/0006877 | A1 | 1/2009 | Lubbers et al. |
| 2009/0049337 | A1 * | 2/2009 | Hsieh et al. .......... 714/14 |
| 2009/0189451 | A1 * | 7/2009 | Roepke .......... 307/66 |
| 2010/0205470 | A1 * | 8/2010 | Moshayedi et al. .......... 713/340 |
| 2010/0250830 | A1 * | 9/2010 | Stenfort .......... 711/103 |
| 2010/0295513 | A1 * | 11/2010 | McCollum et al. .......... 320/134 |

OTHER PUBLICATIONS

ECNmag.com, "1.2A, 1.6MHz Synchronous Boost Regulator from Linear Technology," Top News, Jan. 8, 2009.

Intel® Mainstream SATA Solid State Drives, "Intel® X25-M and X18-M Mainstream SATA Solid-State Drives".

"Get the Lowdown on Ultracapacitors," Penton Media, Inc., Nov. 15, 2007.

STMicroelectronics, "Regulating Pulse Width Modulators, SG3524," Jul. 2000.

Linear Technology, "1.2A Synchronous Step-up DC/DC Converter with Input Current Limit, LTC3125," 2008.

* cited by examiner

US 8,607,076 B2

CIRCUIT APPARATUS WITH MEMORY AND POWER CONTROL RESPONSIVE TO CIRCUIT-BASED DETERIORATION CHARACTERISTICS

RELATED PATENT DOCUMENTS

This patent document claims the benefit under 35 U.S.C. §119(e) of U.S. Provisional Patent Application No. 61/220,851 filed on Jun. 26, 2009, and which is fully incorporated herein by reference.

FIELD OF THE INVENTION

Aspects of the present invention relate to power control features that can be particularly useful for memory applications in which data integrity is an issue.

BACKGROUND

Computer systems generally have several levels of memory; each level of memory can provide differing levels of speed, memory capacity, physical size, power requirements, voltage levels and/or volatility. These aspects are often at odds with each other. For example, increases in speed often lead to corresponding increases in power requirements. For this reason, many systems use a variety of different memories within the same system. From the view of the processor these memories are often hidden in the sense that common data is temporarily cached in smaller, faster memory circuits. This common data is mapped to larger and slower memory circuits, which are accessed when the faster memory does not contain the desired data. The common data, if changed in the cached memory, can eventually be written to the larger and slower memory circuits. This allows for the slow memory access time to be hidden so long as the faster memory contains the appropriately mapped data.

Computer systems generally contain some type of mass-storage memory that is able to store data when the computer system is powered down. This type of memory is referred to as nonvolatile memory because it is able to maintain data integrity when the computer system is not powered. Nonvolatile memory, however, can be slower by orders of magnitude relative to various volatile memories. Yet, nonvolatile can also be less expensive (per unit of memory capacity) and/or less power hungry. A common type of nonvolatile mass-storage memory is a hard disc drive (HDD) that uses a rotating magnetic media. HDDs are used for home-computers, servers, enterprise applications and various other devices. Under normal operation a computer system transfers sensitive data from temporary memory to a HDD before the computer system is powered down. This allows for the sensitive data to be saved in memory that persists after the power is removed from the computer system. When the computer system is subsequently powered up, this data can be accessed and used by the computer system.

HDDs with rotating magnetic media have been in use for many years and have undergone various improvements including efficiency, reliability and memory capacity. Various applications, however, are beginning to use other types of nonvolatile memory with more frequency. Solid State Devices/Drives (SSDs) are one such alternative nonvolatile memory. SSDs are attractive for many applications because, unlike HDDs, they have no need for moving parts. Thus, they are not subject to mechanical wear inherent in HDDs. Another advantage of SSDs over traditional HDDs is that physical movement of the HDD can interrupt accesses to the rotating media. Thus, HDDs often include various mechanisms to compensate for mechanical shocks. Speed, cost and power requirements also factor into the selection of SSDs or HDDs.

While SSDs exhibit various desirable characteristics as relative, for example, to rotating magnetic media, the implementation of SSDs remains challenging and SSDs have not yet replaced HDDs with rotating magnetic media. Aspects of the present invention, although not limited thereto, can be appreciated in the context of such mass-memory storage devices.

SUMMARY

The present invention is directed to systems and methods for use with power control features of a variety of memory applications, including those in which data integrity is an issue. These and other aspects of the present invention are exemplified in a number of illustrated implementations and applications, some of which are shown in the figures and characterized in the claims section that follows.

Consistent with one embodiment of the present invention, a solid-state memory device is implemented to store data in response to data accesses under the control of a memory control circuit. The device includes a primary solid-state memory circuit that maintains data integrity in the absence of primary operating power. A caching memory circuit maps to the primary memory circuit. The caching memory circuit provides the memory control circuit with access to a set of data representing a cached portion of memory that is mapped to the primary memory circuit. A power circuit carries the primary operating power to the memory device. A backup power circuit includes a power module having and securing a power-reservoir circuit. The power-reservoir circuit has a capacitor that is designed to hold a peak charge. The peak charge is sufficient to provide substantially all of the operating power to the memory circuits during a minimum time period sufficient to permit transfer of the cached portion of memory from the caching memory circuit to the primary memory circuit. A notification circuit provides an external user indication of an integrity concern regarding the power-reservoir circuit. A circuit-based structure secures the power-reservoir circuit for operation as part of the memory device and facilitates replacement of the power-reservoir circuit.

According to another embodiment of the present invention, a solid-state memory device is implemented using a solid-state memory circuit configured and arranged to store and provide data. A volatile memory circuit is configured and arranged to cache the data by mapping to a portion of the solid-state memory circuit. A primary power-source is configured and arranged to provide power to the solid-state memory circuit and to the volatile memory circuit. A backup power source is configured and arranged to provide power to the solid-state memory circuit and the volatile memory circuit in response to the available power from primary-power source dropping below a predetermined level. The backup power source includes a set of one or more modules having a physical structure for supporting a power-providing element and a control circuit. The control circuit is configured and arranged to provide an interface with the memory device that allows the power-providing element to be removed and inserted into the memory device while the primary power-source is providing power to the solid-state memory circuit and to the volatile memory circuit. A testing circuit is configured and arranged to test power-providing capabilities of the power-providing element of the at least one module and to provide a test signal that identifies the at least one module and that indicates results of a test of the power-providing capabilities. An output circuit is configured and arranged to generate, responsive to the test signal, a user notification that both identifies the at least one module and provides an indication of the results of the test.

Consistent with another embodiment of the present invention, a memory device is implemented having a plurality of solid state devices (SSDs). Each SSD includes a nonvolatile flash memory circuit configured and arranged to store and provide data; a volatile random access memory (RAM) circuit configured and arranged to cache the data; and a memory controller configured and arranged to control data flow between the nonvolatile memory circuit and volatile memory circuit. A Redundant Array of Independent Discs (RAID) controller is configured and arranged to provide RAID functionality. The RAID functionality is provided by treating each of the plurality of solid state devices as an individual disc within a RAID configuration. A primary power-source is configured and arranged to provide power to the nonvolatile memory circuit and to the volatile memory circuit. A backup power source is configured and arranged to provide power to the nonvolatile memory circuit and to the volatile memory circuit in response to the available power from primary-power source dropping below a predetermined level. The backup power source includes a set of one or more modules having a physical structure for supporting a power-providing supercapacitor, and a backup control circuit. The backup control circuit is configured and arranged to provide an interface with the memory device that allows the power-providing supercapacitor to be removed and inserted into the memory device while the primary power-source is providing power to the nonvolatile memory circuit and to the volatile memory circuit. A testing circuit is configured and arranged to test power-providing capabilities of the power-providing supercapacitor of the at least one module and to provide a test signal that identifies the at least one module and that indicates results of a test of the power-providing capabilities. An output circuit is configured and arranged to generate, responsive to the test signal, a user notification that both identifies the at least one module and provides an indication of the results of the test.

The above summary is not intended to describe each illustrated embodiment or every implementation of the present invention. The figures and detailed description that follow, including that described in the appended claims, more particularly exemplify these embodiments.

BRIEF DESCRIPTION OF THE DRAWINGS

The invention may be more completely understood in consideration of the detailed description of various embodiments of the invention that follows in connection with the accompanying drawings as follows.

Figure 1:
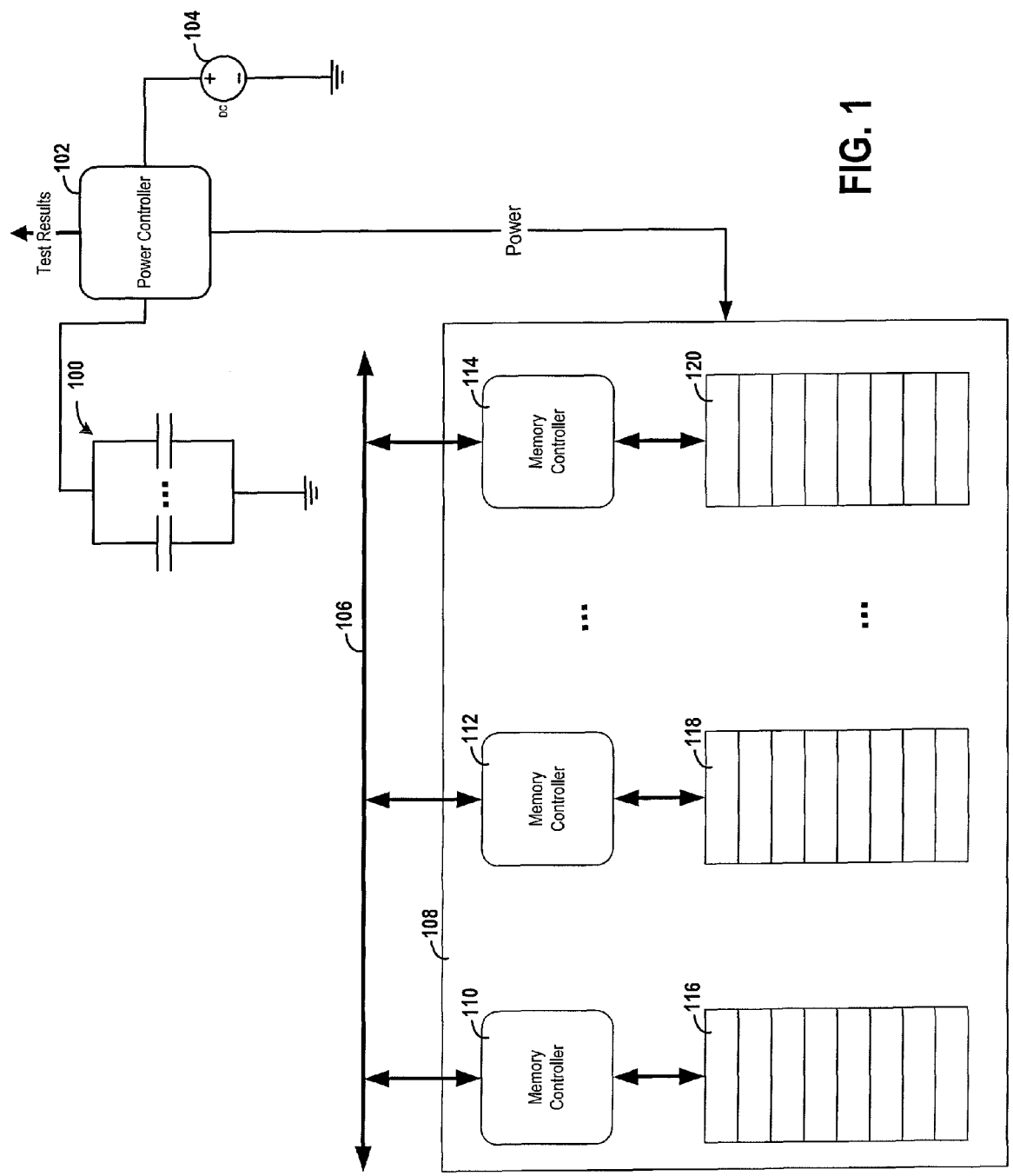
FIG. 1 depicts a system diagram of SSDs having a backup power source, consistent with an embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present invention are believed to be useful for power control in memory devices, circuits and systems. A particular application of the present invention relates to solid state devices (SSDs) that provide nonvolatile memory storage alternatives to traditional rotating magnetic media. While the present invention is not necessarily limited to such applications, various aspects of the invention may be appreciated through a discussion of various examples using this context.

Solid state devices operate using semiconductor technology and without the need for using the electrical properties of a vacuum and mechanical action, or moving parts. One type of SSD uses nonvolatile flash memory to store data. Flash memory is often used for handheld devices for which space and/or power requirements are at a premium. Flash memory also has the added benefit of not being as susceptible to mechanical perturbations. For other applications, such as enterprise servers, SSDs using flash memory have not received huge commercial success. It has been recognized that improvements in SSD reliability would facilitate their use in such applications.

HDDs with rotating magnetic media can utilize the kinetic energy from the spindle motor to briefly maintain drive supply voltages in the event of an unexpected power loss. For example, back-electromotive force (EMF) is converted into electrical power and the drive is allowed to write data from a temporary/volatile cache to the nonvolatile rotating magnetic media. This property can be highly-valued in applications where data integrity is of high-import.

SSDs do not have rotating magnetic media, and therefore, data stored in temporary/volatile memory/cache locations can be lost in the event of an unexpected loss of power. To address this issue, a secondary power source can be used in place of back-electromotive force. This secondary power source provides power to the SSD in the event of unexpected losses of power, thereby allowing for data from a temporary/volatile cache to be written to the nonvolatile SSD memory. Two, non-limiting, examples of secondary power sources include a battery and a capacitor circuit. A controller detects a loss of power from the primary supply and engages the secondary power source. The contents of volatile memory circuits are then transferred to nonvolatile memory circuits. For further details on one example of how to implement such a controller, reference can be made to U.S. Pat. No. 7,269,755 to Moshayedi et al., which is fully incorporated herein by reference.

Both batteries and supercapacitors, also referred to as ultracapacitors, are elements that can be subject to reliability issues. For instance, the power-capabilities of both batteries and capacitors can degrade over time. If the degradation is severe, the power-capabilities of the backup power source may be insufficient to ensure all data is written from the volatile memory circuit during a power-loss event.

New technologies in the capacitive storing arena are emerging. These technologies offer improvements in storage capacity, capacity-to-size ratios, equivalent-series resistances (ESR) as well as other areas. Various ultra/super capacitor technologies have suffered from significant problems with reliability and life-expectancy. New technologies have been and are currently being developed to improve upon the reliability and life-expectancy of capacitor technology. These improvements suggest that supercapacitor usage can be expanded into new areas. For all of the suggested promise of such newly developed technology, however, the improved reliability and life-expectancy is necessarily a prediction of long-term reliability. In particular, long-term reliability for technology that has only been in existence for a short-period of time is, at best, based upon projections. Recognizing this often overlooked problem, aspects of the present invention are particularly useful for addressing the uncertainty in the reliability and life-expectancy of such new technology. Moreover, new supercapacitor technology is on the horizon. Knowledge of these characteristics is of particular import for applications that demand high-reliability. Many such systems require that critical components meet minimum reliability criterion. Without hard data on the reliability of the super capacitors, it is only possible to use predictive models to estimate long-term failure characteristics. Prediction-only knowledge of supercapacitors, however, can be insufficient to guarantee sufficient reliability depending upon the application. Aspects of the present invention can be particularly useful for addressing these and other problems associated with supercapacitors.

One aspect of the present invention relates to the ability to test the power-providing capabilities of a backup power source over the entire life of the capacitor. The results of the test can be used to provide warning that the power source has degraded to the point that data loss might occur during a power-loss event. Other aspects of the present invention facilitate replacement of the backup power source in response to failure detection.

In one embodiment of the present invention, a supercapacitor backup module can be programmed according to a predicted deterioration for supercapacitors. Periodic testing of the supercapacitors during their operation in the field is compared against the predicted deterioration to determine a failure event. To ensure reliability for the system even in the absence of certain knowledge of the deterioration for supercapacitors, the system can be designed to allow for replacement of the supercapacitors in circuit. Moreover, some implementations can include redundant supercapacitor(s) so that a potential failure of a supercapacitor does not render the backup module unable to provide sufficient power in the event of a power loss.

According to a specific embodiment of the present invention, the backup power module can log characteristics of the supercapacitor including the in-circuit test results. The logged information can be compiled from numerous systems in the field and predicted deterioration for supercapacitors can be modified using actual results obtained from the field. The modified deterioration characteristics can then be downloaded to the backup power modules in the field and/or used in subsequent backup power modules.

Potential integrity concerns for the backup power source can be determined as a function of a time period during which the backup power source is expected to provide power. For a supercapacitor the power-providing capabilities can be measured as a function of a charge depletion period. During this period, the super capacitor should be capable of providing an amount of power/voltage sufficient to operate the memory of the SSD. The time period is a function of the time necessary to ensure that all data is flushed from the cache and written to the nonvolatile memory. In certain embodiments, the charge depletion period is substantially more than the minimum time period to ensure that there is a margin of error. This margin of error can be, for example, between five percent and twenty percent.

Another aspect of the present invention relates to the ability to replace a backup power source without replacing the entire SSD. In this manner, the useful lifespan of the SSD is decoupled from the useful lifespan of the backup power source. In certain embodiments, the replaceable backup power source can be removed while the SSD still provides memory functions. A hot-swappable feature, such as this, can be particularly useful for applications that require a high-level of reliability and/or do not allow for much down-time.

According to another aspect of the present invention, redundant backup power sources are used. This can be particularly useful for allowing the replacement of a failed power source without comprising the ability of the SSD to handle a power-loss event.

Yet another aspect of the present invention relates to the concept of sharing a set of backup power sources between multiple SSDs. This can be useful for a number of different reasons, some of which are discussed in more detail below.

Embodiments of the present invention incorporate these and other aspects in various combinations and also as individual components of a device, method or system. While a number of combinations are discussed herein, the present invention is not limited to those combinations that are expressly recited. Rather, the present invention is applicable to a host of different applications and combinations for the various teachings herein.

Turning now to the figures, FIG. 1 depicts a system diagram of SSDs having a backup power source, consistent with an embodiment of the present invention. Each SSD includes a memory controller and associated memory. Primary power source 104 provides power to memory 108. Power controller 102 enables power to be drawn from backup power sources 100 in response to power loss from primary power source 104. Bus 106 provides an interface between memory 108 and a processing system (not shown). Memory-system 108 includes memory controllers 110, 112 and 114, which provide an interface to nonvolatile memories 116, 118 and 120.

Memory controllers 110, 112 and 114 control the flow of data to and from nonvolatile memories 116, 118 and 120. Data being written to nonvolatile memories 116, 118 and 120 can be temporarily stored in a volatile caching memory. This can help improve the efficiency and speed of memory accesses to the SDD.

In the event of a power-loss event, memory controllers 110, 112 and 114 perform a cache flushing operation to ensure that temporarily stored memory values are written to the nonvolatile memories 116, 118 and 120 before the power loss causes data stored in the cached memory to be lost. The power-loss event can be detected using a variety of different schemes. One such scheme determines whether the primary power drops below a predetermined voltage level. Other non-limiting possibilities include detecting instabilities in the power supply voltage and/or other characteristics that could jeopardize the integrity of the data in the volatile cache memory.

According to one embodiment of the present invention, power controller 102 includes a test circuit for testing the power-providing capabilities of one or more of the backup power sources 100. The results of this testing circuit can be used to indicate potential failures of power sources 100, such as may occur due to degradation over the life-cycle of the power sources. A variety of different implementations can be used to provide this testing function.

In one such implementation, a load is introduced to the power supply and the amount of power provided to the load is measured. For example, the test circuit can apply a resistive element as a load to the power sources 100. The power through the resistor can be monitored to assess the amount of power provided by the backup power sources 100. The results of the test can be used to provide an indication of the power-providing capabilities of one or more of the power sources 100.

In one implementation of the present invention, the power sources 100 include at least one redundant power source element. Failure or removal of the redundant power source(s) would not render the power-providing capabilities of the entire set of power sources 100 insufficient. This can be particularly useful for increasing the reliability of the system. For instance, if the results of the test indicate that one of the power sources is no longer providing sufficient power, or otherwise indicates possible issues, the power providing capabilities of the power sources 100 can still be maintained at a level sufficient to ensure safe operation during a power-loss event. The failed backup power source could then be replaced without compromising the operation of the system.

In one embodiment of the present invention, a backup power source can be provided for each SSD. This can be particularly useful for providing SSDs that conform with existing HDD for factors. Each SSD can be designed to allow for replacement of the backup power source 100. This allows for replacement of the backup power source 100 without the need to also replace the memory and memory controller of the SSD. This can be particularly useful for reducing the cost associated with failure of a backup power source and also for allowing continued access to data stored on the SSD. In certain implementations, each SSD device can have one or more redundant backup power sources. Thus, a failed backup power source can be replaced while maintaining the ability of the SSD to properly handle a power-loss event. According to another implementation, each SSD can have an integrated power source and one or more shared redundant power sources 100 can be used in the event of a failed power source 100. In this manner, when a failure of power source for a particular SSD is detected, a shared power source can be used to supplement SSD having the failed power source until the failed power source is replaced. This can be particularly useful for allowing relatively simple scalability as well as low cost implementations.

In one implementation, each SSD can have an integrated power controller. In another implementation, a single power controller can provide power control and testing functionality for multiple SSDs. System design constraints can be used to determine which type of implementation to use. For instance, having a power controller on each SSD can provide easily scalable implementations by decentralizing the power control functions, whereas a centralized controller can reduce the costs associated with duplicated controllers. According to another implementation, power controller functions can be shared/coordinated between power controllers on each SSD and a centralized power controller.

According to one embodiment of the present invention, the system is designed to allow backup power sources to be removed and inserted while the system continues to operate. This hot-swappable capability is particularly useful for high-reliability applications that do not allow for down-time.

Consistent with an embodiment of the present invention, a computer system that interfaces with the SSDs of FIG. 1 does not require knowledge of the backup-power capabilities. The computer system can treat the entire memory system as a single mass-memory storage device or as a group of mass-memory devices. For instance, the computer system can treat each SSD as an individual hard drive. This can be particularly useful for backwards compatibility and for minimizing the amount of computer system software and/or hardware changes necessary to use aspects of the present invention. Other embodiments, however, allow for the computer system to take advantage of the aspects of the present invention. These embodiments can include, but are not limited to, software programs to monitor and predict power-providing element failures, configuration of testing parameters (e.g., test frequency and/or acceptable test limits) and/or reporting and control functions that provide remote accessibility to the system.

Figure 2:
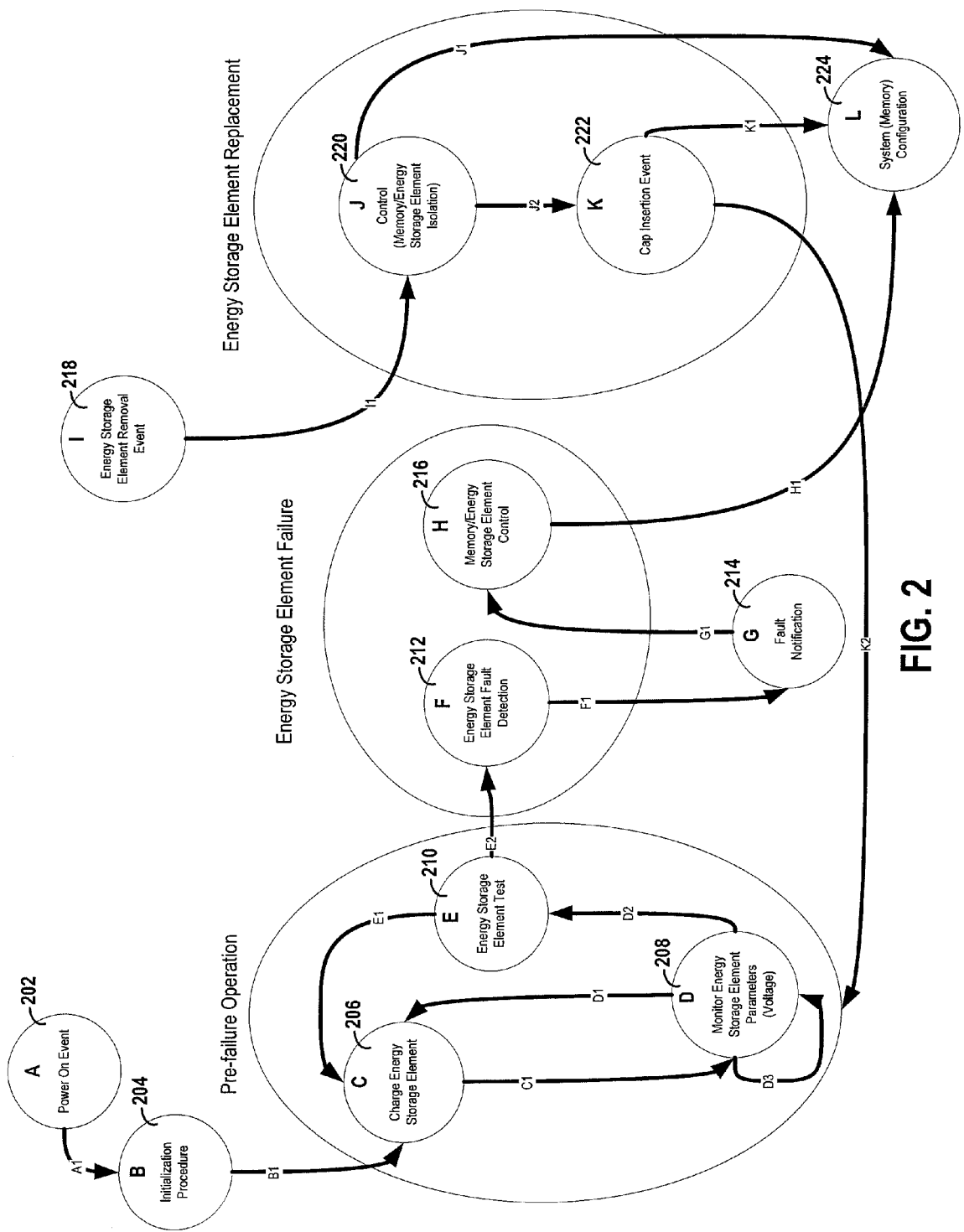
FIG. 2 shows a flow diagram for SSD operation, consistent with an embodiment of the present invention.

FIG. 2 shows a flow diagram for SSD operation, consistent with an embodiment of the present invention. This flow diagram represents one possible implementation for an SSD system. A number of variations from the specific steps and their descriptions can be implemented including variations not explicitly discussed herein.

Power-on event 202 starts (A1) any necessary initialization procedures 204. Once power is provided and the system has been sufficiently configured (B1), the backup-storage element is charged 206. Where the backup-storage element is a supercapacitor, this initial charging will generally involve charging the supercapacitor from a zero charge to a steady-state charge. After and/or during (C1) the charging 206, monitoring 208 can be performed for parameters of the storage element. In one implementation, the parameter includes the voltage level of the capacitor. The monitoring 208 can be continuously or periodically (D3) implemented. The monitoring could also be event triggered (e.g., from an external signal source). Periodically or in response to an input event, the system can test (D2) the power-providing capabilities of the storage element 210. If necessary (D1, E1), the backup-storage element is charged 206. This can be necessary due to power losses due to leakage current, testing power, loss of primary power or other energy losses.

If the result of a test 210 indicates potential problems/failure of a storage element (E2), a fault detection signal can be generated 212. In response to the fault detection (F1) a fault notification can be provided 214. For systems with multiple storage elements, the fault notification can be designed to indicate the type of problem and also the specific storage element that failed the test. The fault notification can take a variety of different forms. A few non-limiting examples include, a display (e.g., warning lights and/or alphanumeric display), notification message sent to system administrator (e.g., electronic-mail, a web interface, or to monitoring software), and internal system software/hardware signaling (e.g., interrupts). These notifications can be accomplished using a variety of communication protocols and methods such as, but not limited to, interrupts, writing to a data register or memory location, inter-integrated circuit (I2C) interface and/or packet-based communications. For instance, the memory controller of an SSD is connected directly to the memory bus of the system. In certain systems, it may be possible for the SSD to communicate across this memory bus. Some systems, however, may not be configured to allow an SSD to initiate communications on this memory bus. Thus, alternative communication lines can be used, such as an I2C bus. Other options include an internal register of the SSD, which can be polled by the system and/or an interrupt that indicates a problem. In addition to fault notification, it is also possible (G1) to provide control functions 216 for the storage element of the SSD. This can include, for example, enabling use of a redundant storage element.

In some implementations, it can be desirable (H1) to modify the operation of the system 224. This modification can include a change in how the memory operations are implemented. For instance, the system functionality could be modified to reduce the frequency of accesses to a SSD with a failed storage element (e.g., by giving a lower priority to the SSD or by shifting critical/often-used data to a different SSD).

At any time a removal event can be detected 218. This removal event signals the system to begin preparation for removal of the storage element. The removal event can be triggered from a variety of sources. One source responds to physical action by a user. This can include, for example, pressing a button or physically taking the storage element out of the system. Another source of the removal event can be provided by software. For example, a software drive can be configured to respond to a user request to remove a storage element. In another example, the removal event is the result of a failed test. Thus, quickly following a failed test for a particular storage element, the storage element can be prepared for removal. Moreover, various combinations of these removal event sources can be used. For example, different levels of removal preparation can be undertaken in response to each type of signal. This can take the form of a set of actions performed in response to an initial software-driven removal event, a second set of actions performed in response to a switch being depressed and a third set of actions in response to actual removal of the device.

In response to the removal event (I1), the storage element can be electrically isolated from the system 220. Preparation for removal can also include discharging energy stored on the storage element (e.g., for safety considerations). Other actions might include disabling all testing and monitoring functions for the storage element. In addition to preparing the storage element for removal, (J1) the system (e.g., memory accesses) can be configured to account for the removal of the storage element 224, as discussed in more detail herein.

The system (J2) responds to an insertion event 222, which indicates that a storage element is to be added to the system. As with the removal event, a number of different sources for this event are possible. Once the storage element has been inserted, the system can return to the standard operation mode in which the newly inserted storage element is charged, tested and, in the event of a power-loss, used to provide backup power.

Figure 3:
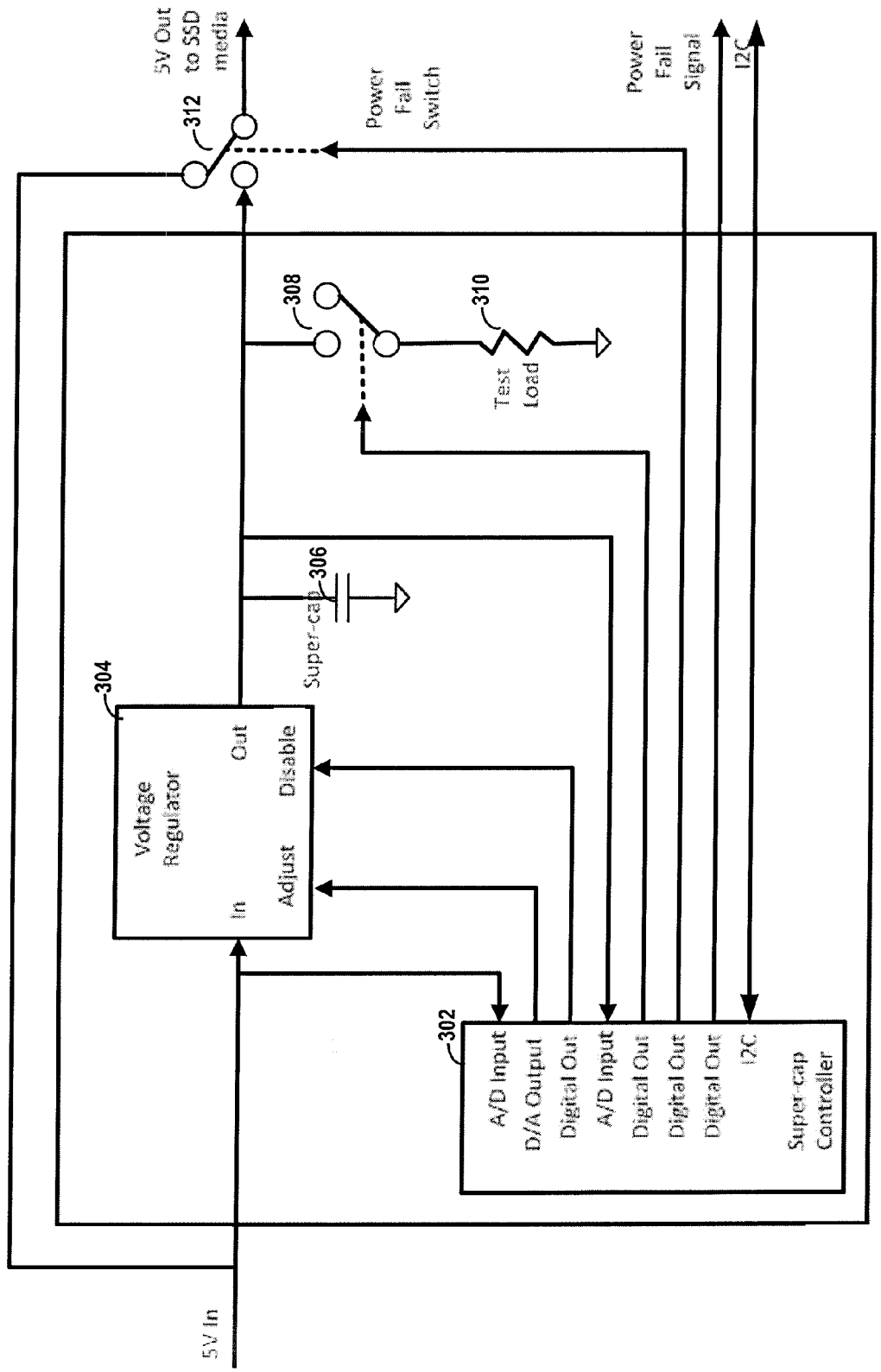
FIG. 3 depicts a power controller and storage element, according to an example embodiment of the present invention.

FIG. 3 depicts a power controller and storage element, according to an example embodiment of the present invention. Storage element 306, depicted as a supercapacitor, provides backup power providing capabilities in the event that the primary power is lost. Optional voltage regulator 304 can be used to control the voltage level of the power provided to storage element 306. Controller 302 can be used to control voltage regulator 304 as well as switches 308 and 312. Test load 310 is used to assess the power-providing capabilities of storage element 306. For instance, switch 308 is used to connect storage element 306 to test load 310. During the test, controller 302 monitors the voltage level of the storage element 306 to ascertain the power-providing capabilities. The results of the test can be provided using a dedicated power-fail signal or over other communication mechanisms, such as 12C. Switch 312 is used to enable the use of storage element 306, e.g., in response to controller 302 detecting the voltage from the primary power source dropping or otherwise exhibiting problematic characteristics.

Figure 4A:
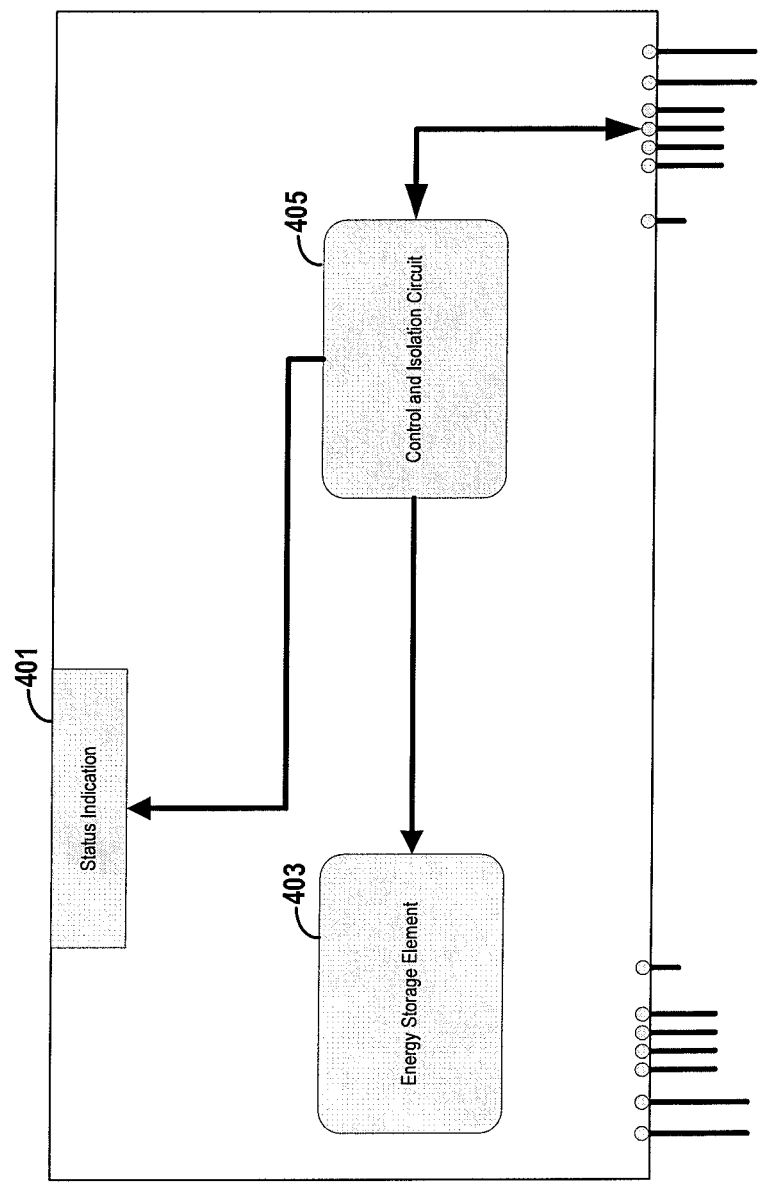
FIG. 4A depicts a hot-swappable module, consistent with an embodiment of the present invention.

FIG. 4A depicts a hot-swappable module, consistent with an embodiment of the present invention. As shown in FIG. 4 a set of one or more (optional) long-connectors provides power to the module. The use of such connectors allow for the module to receive power before signal/data lines are connected during an insertion event. Similarly, these longer connectors allow for the module to remain powered until after the signal/data connectors are no longer connected to the system.

Isolation and control circuitry 405 allows for the module to be inserted or removed from the system during normal operations. The isolation can be for one or more data signals, power to the power energy storage element 403 and power to other circuit portions of the module. This isolation can be implemented using switches, transistors, resistors or other circuit elements. If desired, a display element 401 is implemented to provide feedback to users of the module.

Figure 4B:
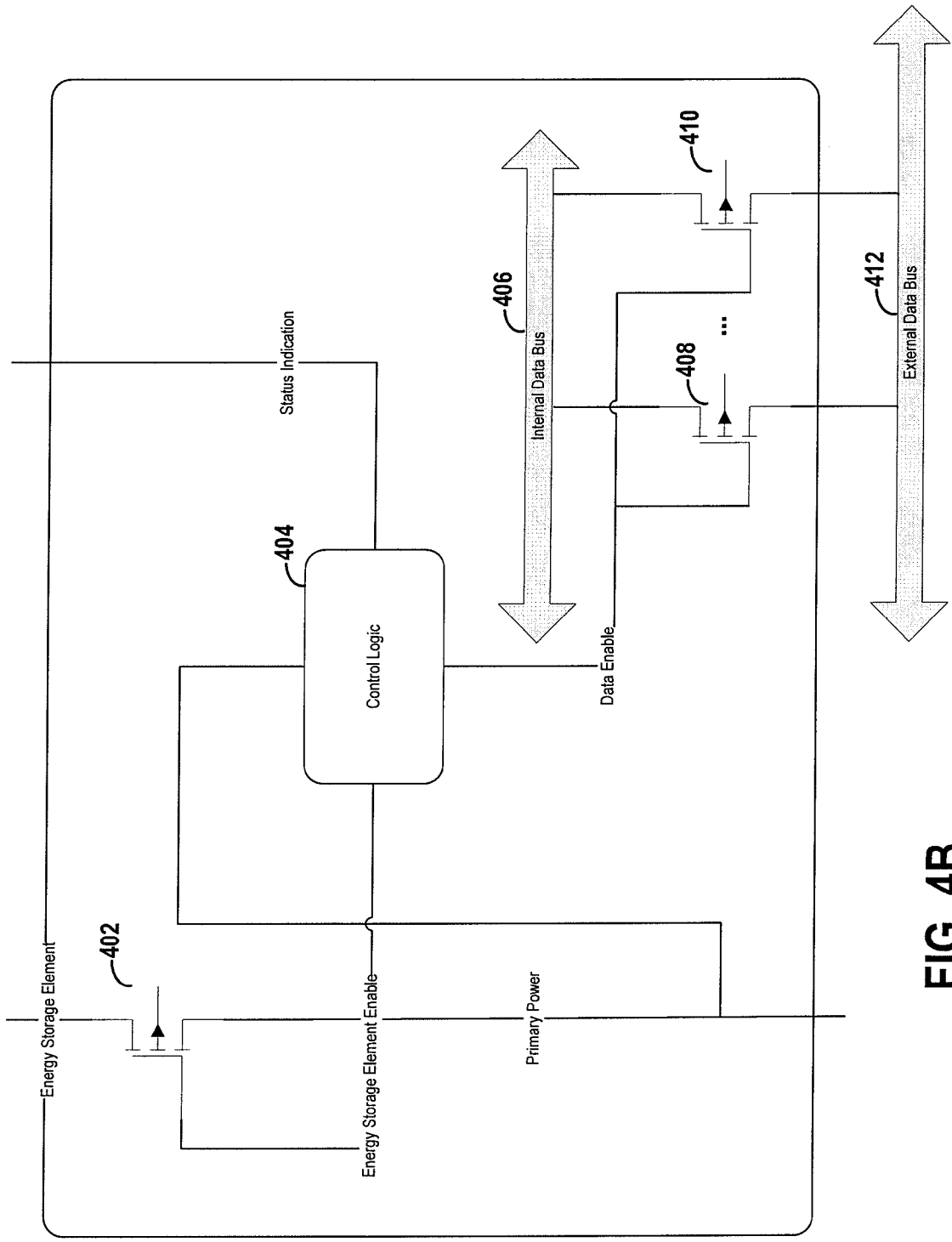
FIG. 4B depicts an isolation circuit for use in a hot-swappable module, consistent with an embodiment of the present invention.

FIG. 4B depicts an isolation circuit for use in a hot-swappable module, consistent with an embodiment of the present invention. Gates 408-410 provide isolation between external data bus 412 and internal data bus 406. This isolation helps prevent glitches on the data lines of the external data bus 412. This can be particularly important where other devices, such as other hot-swappable modules, also communicate using external bus 412. In addition or as an alternative to isolation of the data buses, one implementation of the present invention allows the system to detect insertion or removal of a module and to temporarily suspend data transactions on the external data bus 412.

Gate 412 can be used to isolate the primary power from the energy storage element during insertion. This can be particularly useful for allowing the hot-swappable module and system to initialize and prepare for charging of the storage element. For instance, direct connection of a completely (or nearly completely) discharged capacitor to the primary power would result in a significant power draw on the primary power. This might cause a glitch or other degradation of the voltage provided by the primary power source. Such degradation can cause undesirable functionality of devices that also rely upon the primary power source. Accordingly, intelligent control of insertion events can be provided through the use of control logic 404. Control logic is depicted as being power directly from the primary power. This allows the control logic to function prior to the power providing element being charged.

Although not limiting, an example sequence of operations for an insertion event is as follows. A user physically inserts the hot-swappable module into the system. This results in the establishment of a connection to the primary power. The control logic 404 is activated in response to receiving primary power. The control logic 404 provides status indication (e.g., using an LED) about receipt of the primary power. The status indication is also capable of indicating that the hot-swappable module is not yet fully-enabled. Control logic 404 determines (e.g., based upon a time delay and/or detection of stable primary power) that the internal data bus is stable, and in response, enables gates 408-410. Communications between the system and the hot-swappable module are then established. Control logic 404 provides a status indication to indicate that the module is communicating with the system. The status indication also indicates that the energy storage element is not yet enabled. Based upon the communications and/or other factors, control logic 404 charges the energy storage element by enabling gate 402. Once the energy storage element has been successfully charged, a status indication is provided to indicate that the energy storage element is enabled and charged.

Although not limiting, an example sequence of operations for a removal event is as follows. The control logic 404 determines that a removal event is or will occur. This can be determined from communications received from the system or in response to indications from the hot-swappable module. In one implementation, communications from the system are handled by a software driver that can be configured to respond to user input indicating a removal event is desired. This allows for the system to perform any desired functionality changes prior to, or during the removal of the hot-swappable module. In another implementation, indications from the hot-swappable module can include, but are not limited to, a user switch or button or an electrical connection point that indicates the module is in the process of being removed. Control logic 404 can disable gates 402 and 408-410 to isolate the internal data bus and energy storage element.

The hot-swappable modules are not limited to the aforementioned circuit design and sequences of operations. Instead, a multitude of variations thereof are contemplated. A few non-limiting examples include the use of a number of different data bus-protocols and different types of isolation circuits. Moreover, the control logic 404 can be implemented using discrete logic circuitry, programmable logic devices, microcontrollers configured with specialized instructions, and combinations thereof.

The flexibility of embodiments of the present invention allow for use of the concepts with a variety of different implementations. An example implementation for backup power sources 100 uses a shared set of backup power sources 100 for the SSDs. In one implementation, power sources 100 include redundant power sources in the sense that removal of a power source is possible without reducing the power-providing capabilities below an acceptable threshold. These redundant power sources can be charged and thereby provide additional safety margin for the SSD(s); however, the useful life of supercapacitors can be adversely affected by the amount of charge stored. Accordingly, it is also possible to only charge the redundant power sources in the event of failure detection for another power supply. In this manner, the life of the unused/redundant power sources can be extended.

The ability to individually control each power source can also be useful to allow modifications to the number/size of the SSDs and to implement the corresponding changes to backup power source requirements. For instance, as additional SSDs are added, the power requirements generally increase. If the power requirements increase significantly due to additional SSDs, additional backup power sources may be necessary. Allowing individual selection and control of power sources can be useful in two regards. First, a system could be implemented with sufficient power sources for the maximum allowable number of SSDs. When less than the maximum number of SSDs is used, the system could selectively disable one or more of the power sources, thereby improving the useful life of the power sources. Second, the system could allow for a user to dynamically add power sources as additional SSDs are used.

Figure 5:
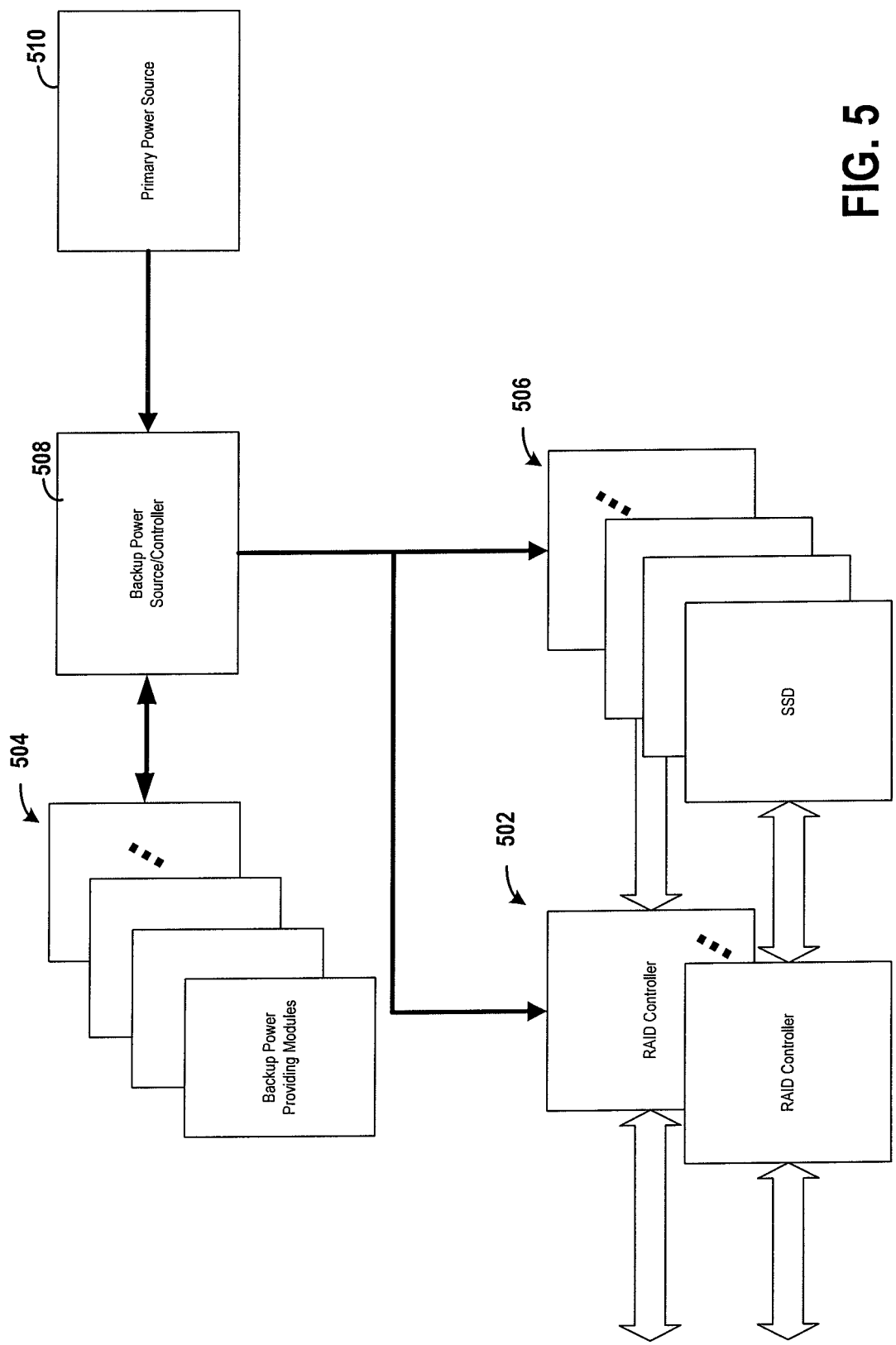
FIG. 5 depicts a memory device implemented with Redundant Array of Independent Discs (RAID) capabilities, consistent with an embodiment of the present invention.

FIG. 5 depicts a memory device implemented with Redundant Array of Independent Discs (RAID) capabilities, consistent with an embodiment of the present invention. The memory device includes an interface for accessing multiple SSDs 506. Each SSD includes a set of flash memory, a set of cache memory and a memory controller. The RAID functionality can be provided by treating each SSD as an independent disc drive. To the processing system, the memory device will appear to be a set of HDDs configured behind a RAID controller 502. However, the memory device can be configured without being constrained by traditional HDD form factors. In some applications, multiple RAID controllers 502 can be implemented.

RAID and other data-storage schemes provide beneficial storage features by coordinating access to an array of otherwise independent memory devices. Various configurations replicate among multiple memory devices to provide redundancy and reliability. Other configurations divide data between devices, e.g., striping, to improve the data throughput. Combinations of both dividing and replicating are also possible. There are a variety of RAID configurations, and the present invention is not limited to one particular RAID configuration. Future RAID configurations will likely also fall within scope of the present invention.

In one implementation, primary power source 510 provides power to the memory device during normal operation and a single backup power source 508 is provided for the entire memory device. The backup power source, however, can include multiple power-providing modules 504. These modules each contain a supercapacitor. Instead of providing a power-providing module for each SSD, each power-providing module can be designed for use with multiple SSDs. This can be particularly useful for supercapacitors because, for example, the cost of supercapacitors is not necessarily a one-to-one correlation with the storage capacity. Thus, two larger supercapacitors may be significantly less expensive than four small supercapacitors having the same total power-providing capabilities as the two larger supercapacitors.

The system also provides monitoring to detect or predict failure of a power-providing module. Each module can be designed for removal from the system without interrupting operation of the SSDs in the system. This hot-swappable feature can be facilitated by providing electrical isolation for the module during removal or insertion of the module.

One implementation implements a RAID controller on a first circuit board/card and the SSDs on different cards. In this manner, SSDs can be added to the system allowing for more flexibility in design and future upgrades. As additional SSDs are added to the system, it may be necessary to also add additional power-providing modules. The hot-swappable nature of the modules can be particularly useful for this type of upgrades as new modules can be easily inserted by a system operator.

An embodiment of the present invention is applicable to memory systems for which there are two levels of memory. The first level of memory is powered by a primary power supply and is subject to data loss or other data integrity issues in the absence of the primary power supply. In the absence of primary power, the second level of memory has increased data integrity relative to the first level of memory. In this manner, a backup power source can be useful for maintaining power to the first level of memory when a primary power loss occurs. In a specific implementation, the second level of memory could be supplied with a secondary power source that provides the increased data integrity. The concept of multiple memory levels can be applied to a variety of different applications that can benefit from the use of the various aspects of the present invention.

Figure 6:
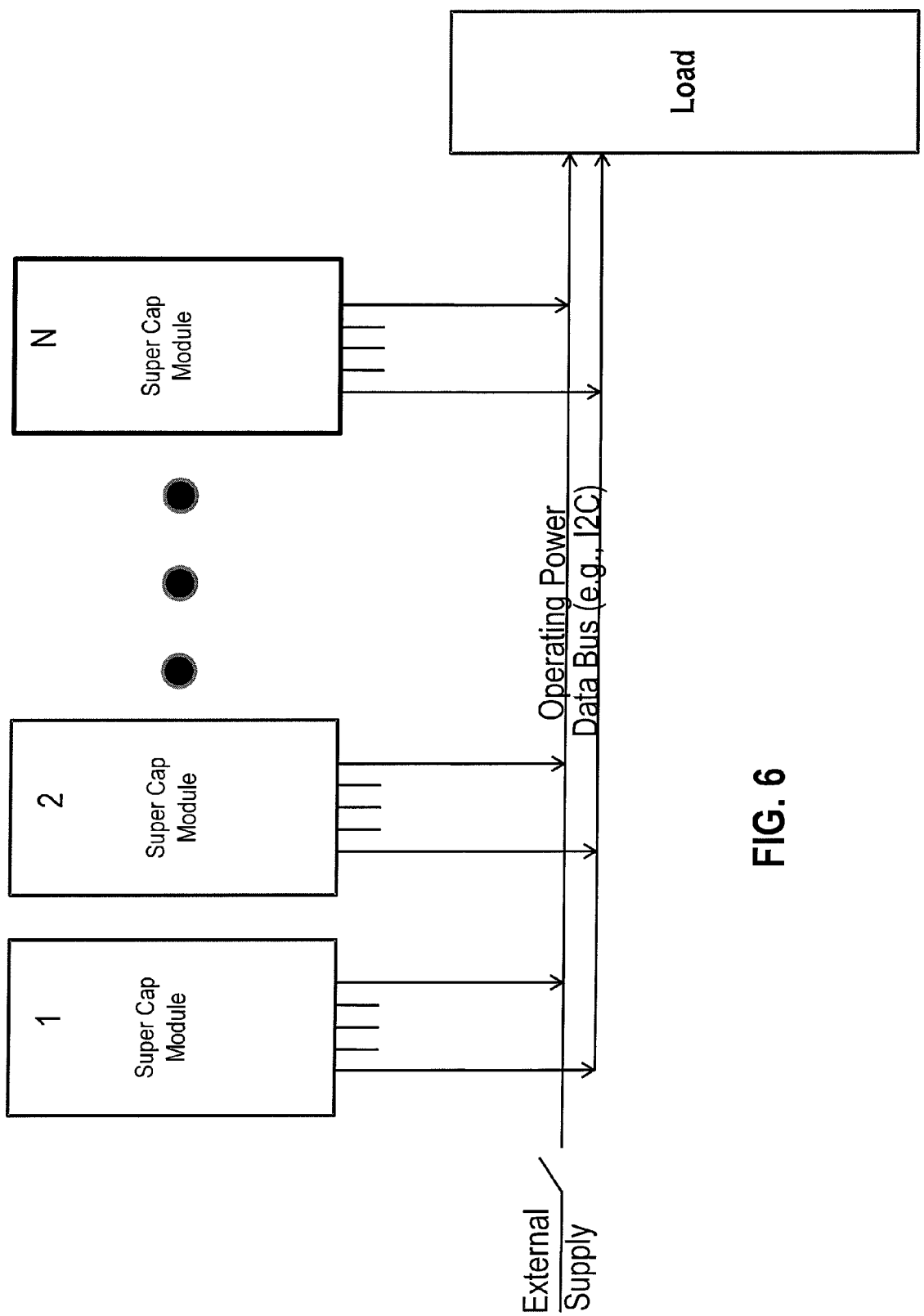
FIG. 6 shows a set of N supercapacitor modules within a system, consistent with an example embodiment of the present invention.

FIG. 6 shows a set of N supercapacitor modules within a system, consistent with an example embodiment of the present invention. Each module 1-N connects to a data bus, such as an I2C bus, and a power bus. The power bus provides power to the load and is also connected with the primary/external power source. When the external power source is functioning normally, the supercapacitor modules contain a charge sufficient to provide primary operating power to the load for a period of time sufficient to store the sensitive data in a nonvolatile location. A failed external power supply may draw energy from the supercapacitor modules, which would reduce the amount of energy available for the load. Thus, some form of isolation (e.g., a switch) can be provided to prevent current/energy draw from the external power source.

In certain embodiments, the supercapacitor modules communicate over the data bus. The communication can be used to announce the presence or indicate the absence of the modules. This information can be used to control the amount of charge stored on each module as will be discussed in more detail hereafter. The communication between modules can be coordinated by providing an address to each module. This can be accomplished by coding each slot of the system with a different address (e.g., using addressing pins providing different address values for each slot). This allows for each module to know and respond to a respective and different address value and also to properly address another module. One implementation allows for each module to contain a unique identifier which distinguishes the module irrespective of any particular slot. This can be particularly useful for tracking modules, which can be replaced or otherwise moved.

In one implementation, the modules communicate with each other and provide the monitoring and control functions independent of a centralized controller. For instance, each module can contain a similar control circuit, e.g., a microprocessor, which monitors the presence of other modules within the system. This allows for a decentralized system and can be beneficial as it does not require an external control device, which may rely upon the external supply. In a particular implementation, one module can serve as the master device. The master device can be determined, for example, based upon the slot of the modules (e.g., the module in the lowest slot with the lowest address value functions as the master device).

In another implementation, a centralized controller can provide monitoring and control functions to the supercapacitor modules. This controller can coordinate the operating parameters and functional aspects of the supercapacitor modules.

In one embodiment of the present invention, the supercapacitor modules are configured to take advantage of excess storage capacity. For instance, the system may include one or more redundant modules. There are a number of configuration choices for dealing with redundant modules. One such configuration is to charge each of the modules so that there is excess energy stored. This takes advantage of the redundant module so as to increase the amount of time that energy can be supplied from the supercapacitor modules. This additional time provided by the redundant module can be also used for additional logging, monitoring or testing of the device. For instance, the system can perform different power-loss routines dependent upon the number of supercapacitor modules in the system and/or the amount of energy available upon a power loss.

Another configuration is to set the charge/voltage level for the supercapacitor modules as function of the number of supercapacitor modules. As the number of supercapacitor modules increases, the amount of energy stored for the same voltage level increases. Thus, the stored voltage level can be decreased as additional modules are introduced. This can be particularly useful for increasing the life-expectancy of the supercapacitor modules, which often have a life-expectancy that varies inversely with the voltage level stored on the supercapacitor.

Yet another configuration involves using one or more supercapacitor modules as a "hot spare." The hot spare supercapacitor module is configured to store little or no energy. Thus, the hot spare is not subject to degradation caused by storage of energy on the supercapacitor.

The configurations can be selected based upon user settings and/or using supercapacitor failure modeling. For example, the voltage on the supercapacitors can be set to control overall replacement costs, monetary and otherwise, by setting voltage levels in a manner that increases the average life-expectancy across all modules in the system. For example, a system may include four modules, one of which is a redundant module. In one configuration, the addition of the fourth module may allow for a reduction of voltage stored on all the supercapacitors. As each supercapacitor is operated at the same voltage, the average life-expectancy is roughly equal a single module's life-expectancy. In a second configuration, the fourth module can be used as a hot spare with little or no voltage. The life-expectancy of the hot spare is significantly higher than that of the other modules and therefore the average life-expectancy is increased. The system can select between these configurations based upon the highest average life-expectancy of the modules.

The cost determination can be modified according to a number of different factors. Often, computer storage devices are upgraded and replaced every few years. Thus the cost determination could be limited to a useful timeframe.

In addition to a cost analysis, the configuration can be set according to a number of different criteria. One such criterion is the reliability of the system. The configuration can be set as a function of the probability of a sequence of events or failures that would jeopardize the integrity of the data. One such sequence includes the failure of multiple modules at nearly the same time. If multiple modules fail close enough in time, then replacement of the failed modules may not be feasible before the multiple failures. This can result in a period of time during which there may not be sufficient energy storage to ensure the integrity of the data in the event of a power-loss.

In another example, a modified version of the hot swap module can be implemented. Rather than keeping a single module as the hot swap module, the system can periodically change which module is operated as the hot swap module by charging and discharging the appropriate supercapacitors. This can be particularly useful for keeping usage of the modules (e.g., due to energy storage) equal between all modules. Alternatively, the system can use this technique to produce an unequal usage between the modules. This can be desirable, for example, to reduce the likelihood of multiple modules failing at the same time. More particularly, the usage of the modules can set such that the modules are expected to fail at different times, thereby reducing the probability of near-simultaneous failure.

Recognizing the particulars of predicted failure characteristics of the supercapacitors are unknowable for newly developed technology, aspects of the present invention relate to the development of replaceable modules with built-in intelligence. These modules can be used as part of a system that is used to develop a characterization of the failure characteristics of the supercapacitors.

In one implementation, the modules can log the usage characteristics. The logged usage characteristics can be correlated with failure events. The data can be retrieved directly from the modules by reading a log file stored on the module. For instance, failed modules can be retrieved from customers and their log files can be uploaded to a database for analysis. Another data retrieval technique is to upload usage or failure data to a remote database over a network, such as the Internet.

Software drivers can be configured to periodically upload the data to a remote server location. In one implementation a system administrator can opt-in or opt-out of this uploading.

Embodiments of the present invention also relate to the ability to update modules with new failure characteristics. This updating can take the form of a firmware change, software driver change or both.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. For instance, such changes may include variations of the type of backup power source. Such modifications and changes do not depart from the true spirit and scope of the present invention, which is set forth in the following claims.

What is claimed is:

1. A solid-state memory device that stores data in response to data accesses under control of a memory control circuit, the memory device comprising:
    a primary solid-state memory circuit configured and arranged to maintain data integrity in the absence of primary operating power and to store data in response to a write request from the memory control circuit;
    a caching volatile memory circuit mapped to the primary memory circuit, configured and arranged to provide the memory control circuit with access to a set of data representing a cached portion of data that is stored in the primary memory circuit;
    a circuit for carrying primary operating power to the memory device; and
    a backup power circuit-based structure including
        a power module having and securing a power-reservoir circuit, including a capacitor, designed to hold a peak charge that is sufficient to provide substantially all operating power to the memory circuits during a minimum time period sufficient to permit transfer of the cached portion from the volatile memory circuit to the solid-state memory circuit, wherein the backup power circuit-based structure is configured and arranged to receive deterioration characteristics for the power-reservoir circuit for a readable log file,
        a notification circuit configured and arranged to provide an external user indication of an integrity concern regarding the power-reservoir circuit in response to the deterioration characteristics for the power-reservoir circuit, and
        a circuit-based structure that is configured to secure the power-reservoir circuit for operation as part of the memory device and to facilitate physical replacement of the power-reservoir circuit by electrically isolating the power-reservoir circuit from the memory device prior to physical replacement while maintaining access to the set of data.

2. The device of claim 1, further including a testing circuit configured and arranged to test power-providing capabilities of the power-reservoir circuit and to provide test data indicative of the power-providing capabilities to the notification circuit and wherein the notification circuit is further configured and arranged to provide the external user indication as in response to the provided test data.

3. The device of claim 1, wherein the power-reservoir circuit is a supercapacitor having parameters, including a capacitance rating and a maximum voltage rating, to provide a charge depletion period that is substantially more than the minimum time period, the depletion period being due to the supercapacitor providing substantially all of the operating power and wherein the solid-state memory circuit is a mass data-storage circuit.

4. The device of claim 1, wherein the solid-state memory circuit is a mass data-storage circuit, wherein the backup power circuit-based structure is configured and arranged to facilitate maintenance of a log of usage characteristics for the power-reservoir circuit in a log file for uploading the log file to a remote database, and to receive the deterioration characteristics for the power-reservoir circuit for uploading from the readable log file.

5. The device of claim 1, wherein the memory device further includes a testing circuit configured and arranged to test degradation of a charge depletion period of a supercapacitor of the power-reservoir circuit, the depletion period being due to the supercapacitor providing substantially all of the operating power, and to provide test data indicative of power-providing capabilities for the supercapacitor.

6. The device of claim 1, wherein the solid-state memory circuit is a mass data-storage circuit and the memory device further includes a testing circuit configured and arranged to test power-providing capabilities of a supercapacitor of the power-reservoir circuit by discharging a portion of stored charge on the supercapacitor and to provide test data indicative of power-providing capabilities for the supercapacitor.

7. The device of claim 1, wherein facilitating replacement of the power-reservoir circuit includes electrically isolating the power-reservoir circuit from the memory device.

8. The device of claim 1, wherein facilitating replacement of the power-reservoir circuit includes electrically isolating the power-reservoir circuit from the memory device in response to an extraction warning signal provided by an external user-switch.

9. The device of claim 1, wherein facilitating replacement of the power-reservoir circuit includes electrically isolating the power-reservoir circuit from the memory device in response to an extraction warning signal provided by a processor system.

10. A solid-state memory device for use with a supercapacitor subject to uncertain failure characteristics, the device comprising:
    a solid-state memory circuit configured and arranged to store and provide data;
    a volatile memory circuit configured and arranged to cache the data by mapping to a portion of the solid-state memory circuit, providing cached version of data stored in the solid-state memory circuit and thereby hiding access speeds of the solid-state memory circuit;
    a primary power-source configured and arranged to provide power to the solid-state memory circuit and to the volatile memory circuit;
    a backup power source configured and arranged to provide power to the solid-state memory circuit and the volatile memory circuit in response to the available power from primary-power source dropping below a predetermined level, the backup power source including a set of at least one module having a physical structure for supporting
        a supercapacitor-based power-providing element, and
        a control circuit configured and arranged to provide an interface with the memory device that allows the power-providing element to be removed and inserted into the memory device while the primary power-source is providing power to the solid-state memory circuit and to the volatile memory circuit, the backup power source being configured and arranged to receive deterioration characteristics for the supercapacitor-based power-providing element for a readable log file;
a testing circuit configured and arranged to test power-providing capabilities of the power-providing element of the at least one module and to provide a test signal that identifies the at least one module and that indicates results of a test of the power-providing capabilities; and
an output circuit configured and arranged to respond to the deterioration characteristics for the supercapacitor-based power-providing element and to generate, responsive to the test signal, a user notification that both identifies the at least one module and provides an indication of the results of the test.

11. The device of claim 10, further including a physical switch designed to be depressed by a user, the switch providing an extraction event notification to the control circuit, and a communication interface circuit configured and arranged to detect the presence of other modules of the set of modules and wherein control circuit is further configured and arranged to determine whether or not to charge the power-providing element in response to detecting the presence of other modules of the set of modules and thereby determining whether or not the power-providing element is redundant.

12. The device of claim 10, further including isolation circuitry to electrically isolate the power-providing element from the device to allow the power-providing element to be removed and inserted into the memory device while the primary power-source is providing power to the solid-state memory circuit and to the volatile memory circuit.

13. The device of claim 10, wherein the set of modules includes a plurality of modules and further including at least one redundant power-providing element.

14. The device of claim 10, wherein the set of modules includes a plurality of modules configured and arranged in parallel to provide power to the solid-state memory circuit and the volatile memory circuit and wherein at least one of the modules of the set of modules is redundant and is charged in response to a test failure signal from the test circuit.

15. The device of claim 10, further including
a set of solid-state drives each having a memory controller configured and arranged to access a respective portion of each of the solid-state memory circuit and the volatile memory circuit; and
a Redundant Array of Independent Discs (RAID) controller configured and arranged to provide RAID functionality whereby the solid-state drives represent respective discs for the RAID functionality.

16. The device of claim 15, wherein the solid-state memory circuit uses flash memory.

17. The device of claim 10, wherein the test signal is an interrupt signal.

18. A memory device comprising:
a plurality of solid state devices each including
a nonvolatile flash memory circuit configured and arranged to store and provide data,
a volatile random access memory (RAM) circuit configured and arranged to cache the data, and
a memory controller configured and arranged to control data flow between the nonvolatile memory circuit and volatile memory circuit;
a Redundant Array of Independent Discs (RAID) controller configured and arranged to provide RAID functionality using each of the plurality of solid state devices as a disc in the RAID functionality;
a primary power-source configured and arranged to provide power to the nonvolatile memory circuit and to the volatile memory circuit;
a backup power source configured and arranged to provide power to the nonvolatile memory circuit and to the volatile memory circuit in response to the available power from primary-power source dropping below a predetermined level, the backup power source including a set of at least one module having a physical structure for supporting
a power-providing supercapacitor circuit configured and arranged to provide the power to the memory circuits, and
a backup control circuit configured and arranged to provide an interface with the memory device that allows the power-providing supercapacitor circuit to be removed and inserted into the memory device while the primary power-source is providing power to the nonvolatile memory circuit and to the volatile memory circuit, the backup power source being configured and arranged to receive deterioration characteristics for the power-providing supercapacitor circuit for a readable log file;
a testing circuit configured and arranged to test power-providing capabilities of the power-providing supercapacitor circuit of the at least one module and to provide a test signal that identifies the at least one module and that indicates results of a test of the power-providing capabilities; and
an output circuit configured and arranged to respond to the deterioration characteristics for the power-providing supercapacitor circuit and generate, responsive to the test signal, a user notification that both identifies the at least one module and provides an indication of the results of the test.

* * * * *